United States Patent
Tanaka et al.

(10) Patent No.: US 8,148,641 B2
(45) Date of Patent: Apr. 3, 2012

(54) ANISOTROPIC CONDUCTIVE MATERIAL, CONNECTED STRUCTURE, AND PRODUCTION METHOD THEREOF

(75) Inventors: Yoshito Tanaka, Tochigi (JP); Jun Yamamoto, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 254 days.

(21) Appl. No.: 12/451,501

(22) PCT Filed: Apr. 15, 2008

(86) PCT No.: PCT/JP2008/057317
§ 371 (c)(1),
(2), (4) Date: Nov. 16, 2009

(87) PCT Pub. No.: WO2009/001605
PCT Pub. Date: Dec. 31, 2008

(65) Prior Publication Data
US 2010/0103630 A1    Apr. 29, 2010

(30) Foreign Application Priority Data

Jun. 26, 2007  (JP) .................. 2007-167479
Feb. 19, 2008  (JP) .................. 2008-037781

(51) Int. Cl.
*H05K 1/00* (2006.01)
(52) U.S. Cl. ........ 174/250; 174/256; 174/259; 174/260; 438/21; 438/61; 438/64; 438/553; 428/141; 428/413; 385/14; 29/832; 257/686; 257/774
(58) Field of Classification Search .................. 174/250, 174/256, 259, 260; 438/21, 61, 64, 553; 428/141, 413; 385/14; 29/832; 257/686, 257/774
See application file for complete search history.

(56) References Cited

U.S. PATENT DOCUMENTS

| | | | |
|---|---|---|---|
| 6,413,790 B1 * | 7/2002 | Duthaler et al. | 438/21 |
| 2002/0119584 A1 * | 8/2002 | Duthaler et al. | 438/21 |
| 2003/0113573 A1 * | 6/2003 | Pepin | 428/553 |
| 2004/0047127 A1 | 3/2004 | Yamauchi et al. | |
| 2004/0058184 A1 * | 3/2004 | Pepin | 428/553 |

(Continued)

FOREIGN PATENT DOCUMENTS

JP    A 07-057805    3/1995
(Continued)

OTHER PUBLICATIONS

International Search Report issued Jul. 29, 2008 for National Phase Application No. PCT/JP2008/057317, filed Apr. 15, 2008.

(Continued)

*Primary Examiner* — Xiaoliang Chen
(74) *Attorney, Agent, or Firm* — Oliff & Berridge, PLC

(57) ABSTRACT

An anisotropic conductive material prevents conduction resistance from varying among bumps or among linear terminals when connecting an IC chip or a flexible wire to a wiring board via the anisotropic conductive material. The anisotropic conductive material is formed by dispersing conductive particles in an insulating binder. The minimum melt viscosity $[\eta_0]$ thereof is in a range of from $1 \times 10^2$ to $1 \times 10^6$ mPa·sec, and satisfies the following equation (1):

$$1 < [\eta_1]/[\eta_0] \leq 3 \tag{1}$$

where in the equation (1), $[\eta_0]$ represents the minimum melt viscosity of the anisotropic conductive material, and $[\eta_1]$ represents a melt viscosity at a temperature $T_1$ which is 30° C. lower than a temperature $T_0$ at which the minimum melt viscosity is exhibited.

7 Claims, 4 Drawing Sheets

U.S. PATENT DOCUMENTS

| | | |
|---|---|---|
| 2004/0079464 A1 | 4/2004 | Kumakura |
| 2005/0026326 A1 | 2/2005 | Kiritani et al. |
| 2005/0045064 A1* | 3/2005 | Oya .................. 106/170.27 |
| 2006/0204718 A1* | 9/2006 | Kawakami .................. 428/141 |
| 2006/0263003 A1* | 11/2006 | Asai et al. .................. 385/14 |
| 2006/0292396 A1* | 12/2006 | Pepin .................. 428/692.1 |
| 2008/0118199 A1* | 5/2008 | Asai et al. .................. 385/14 |

FOREIGN PATENT DOCUMENTS

| | | |
|---|---|---|
| JP | A 2000-340614 | 12/2000 |
| JP | A 2002-252254 | 9/2002 |
| JP | A 2004-335916 | 11/2004 |
| JP | A 2004-363167 | 12/2004 |
| JP | A 2005-200521 | 7/2005 |
| WO | WO 02/054476 A1 | 7/2002 |
| WO | WO 03/001586 A1 | 1/2003 |

OTHER PUBLICATIONS

Jan. 9, 2012 Office Action issued in Korean Patent Application No. 2009-7026599 (with translation).

* cited by examiner

[Fig. 1]
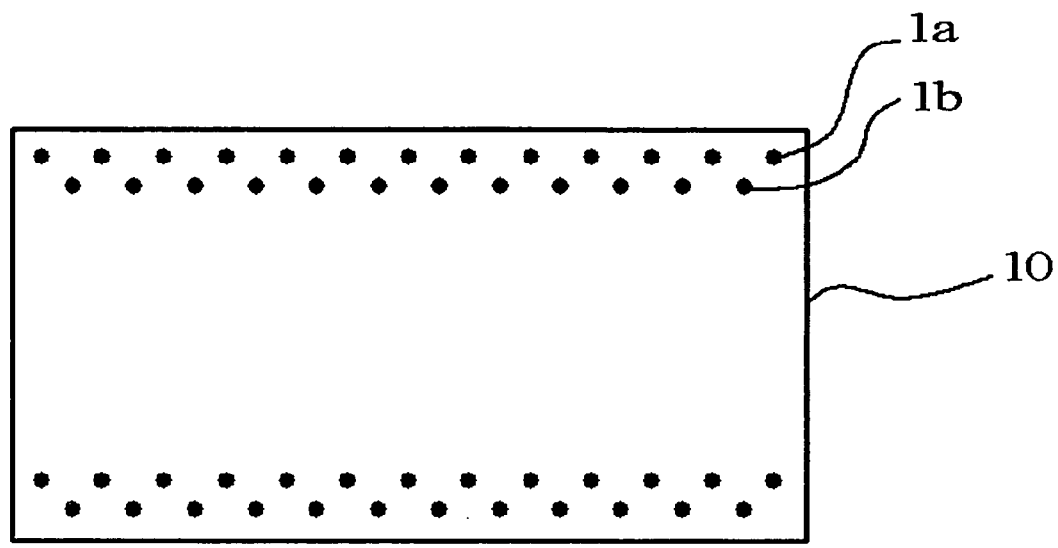
[Fig. 2]
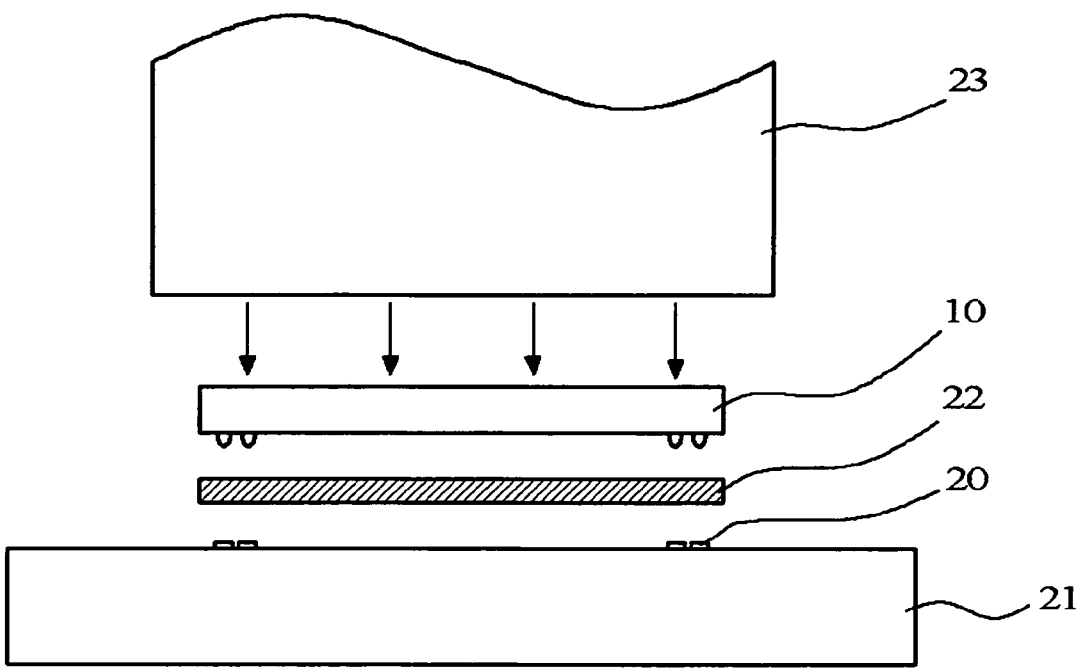

[Fig. 3]
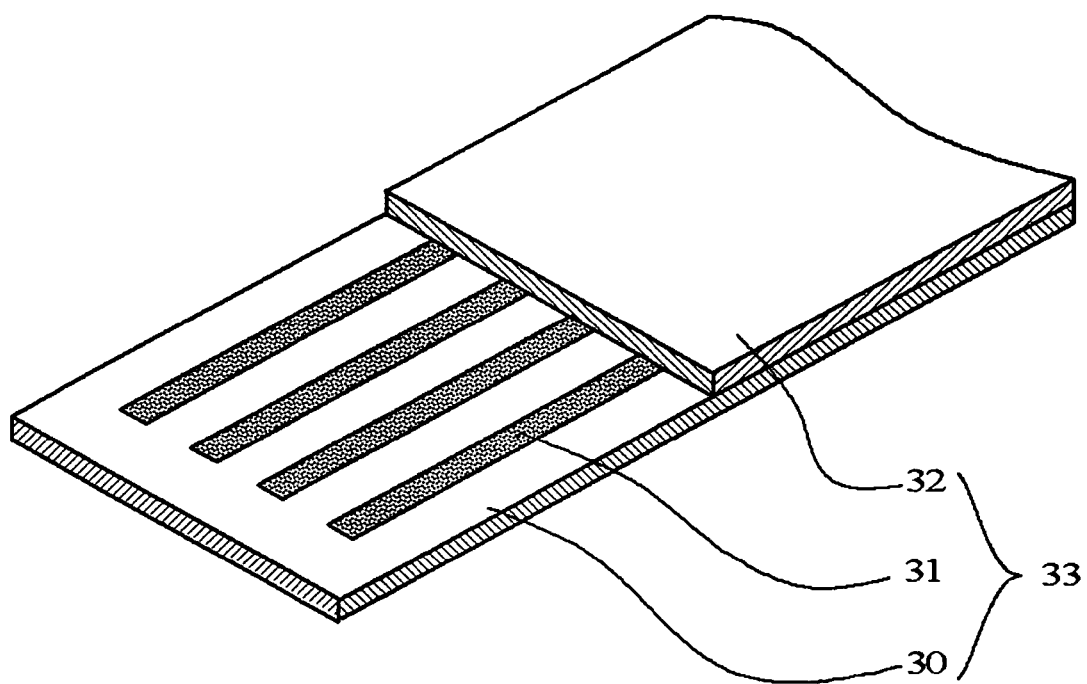
[Fig. 4]
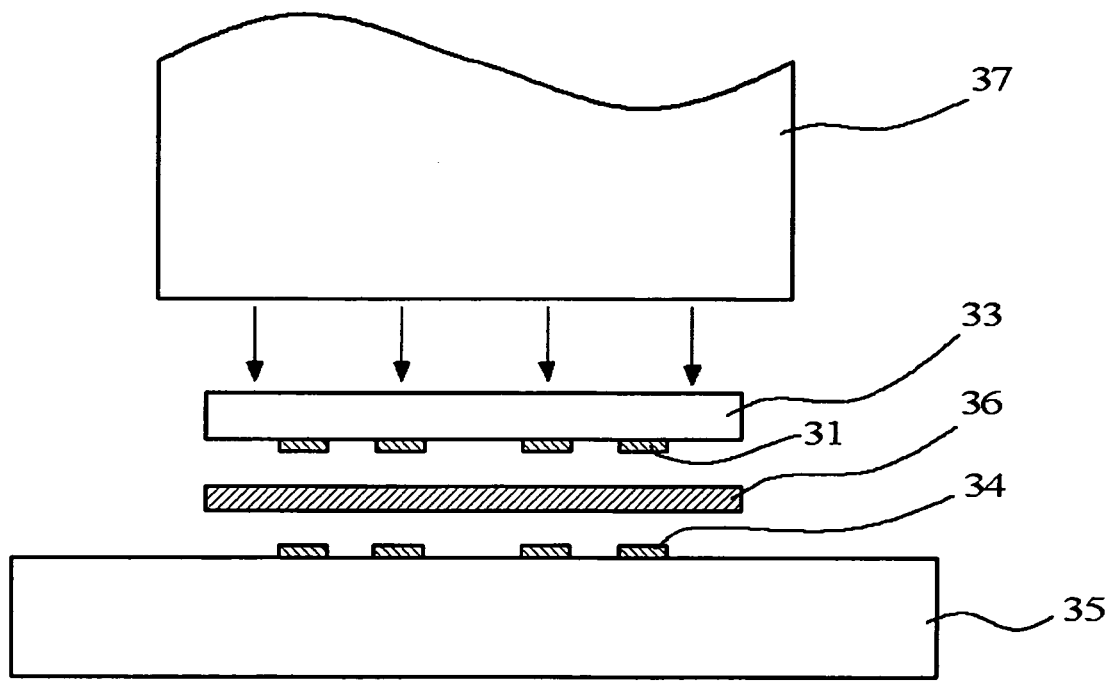

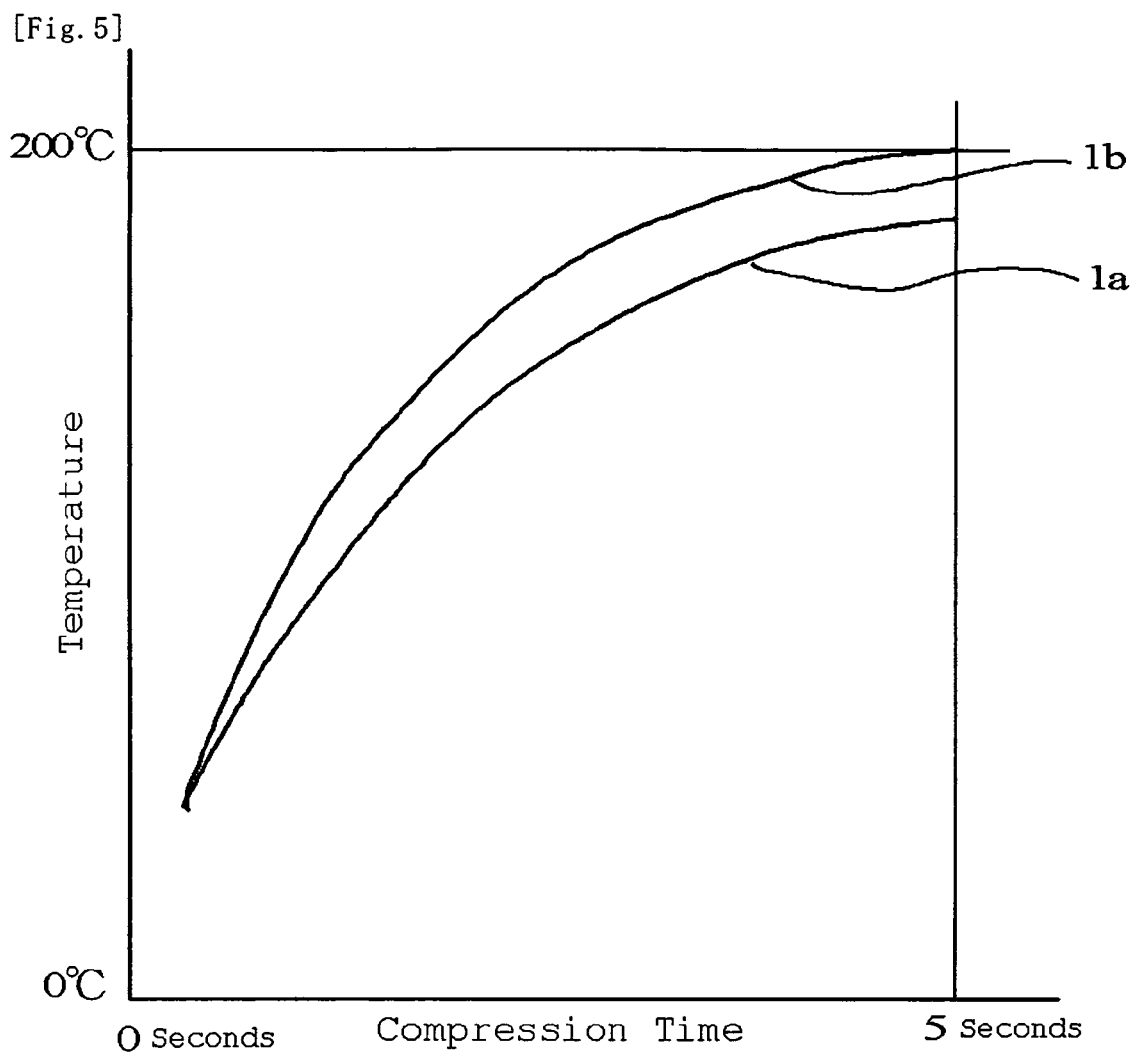

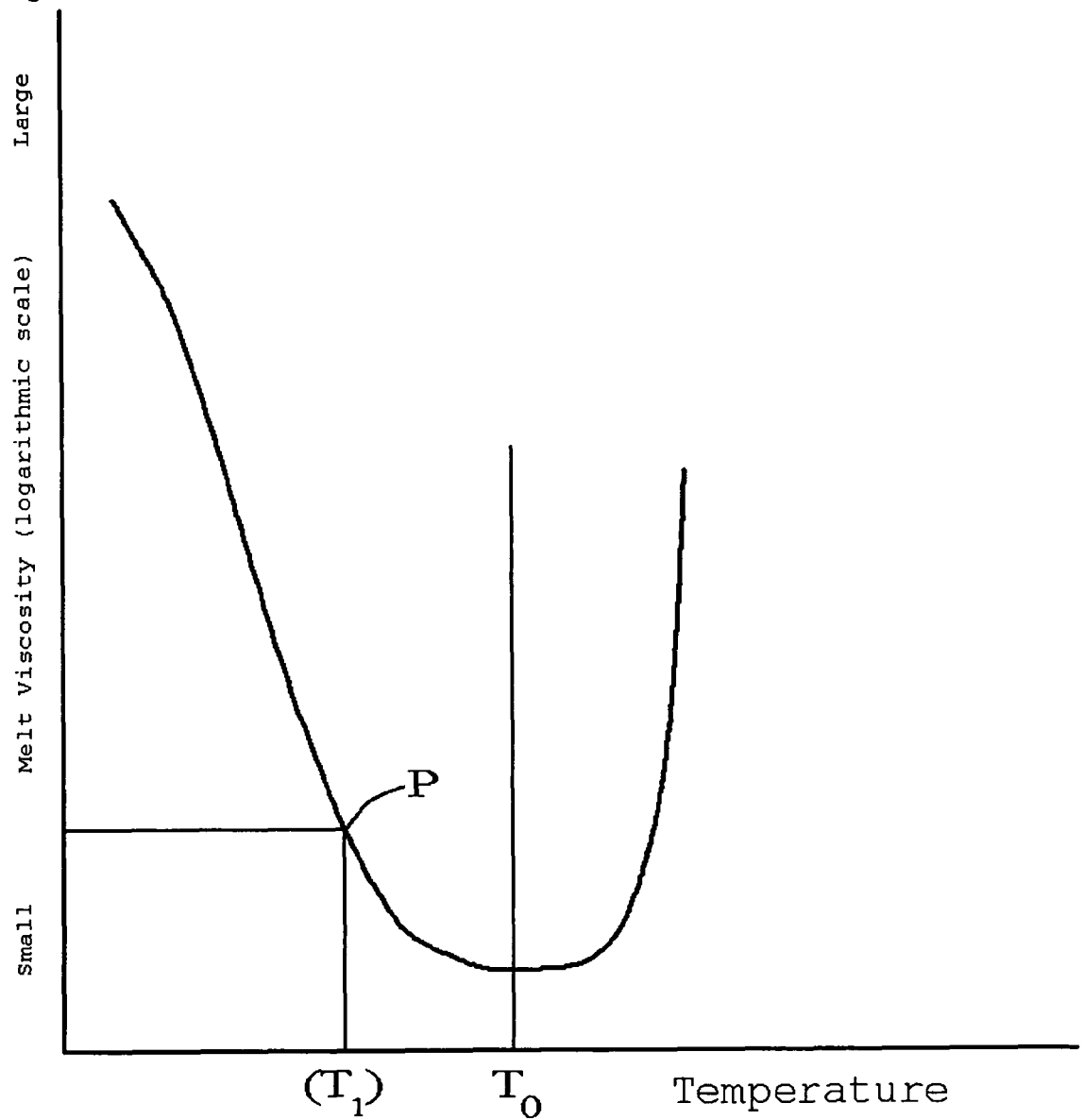
[Fig. 6]

ANISOTROPIC CONDUCTIVE MATERIAL, CONNECTED STRUCTURE, AND PRODUCTION METHOD THEREOF

TECHNICAL FIELD

The present invention relates to an anisotropic conductive material in which conductive particles are dispersed in an insulating binder, a connected structure utilizing this anisotropic conductive material, and a production method thereof.

BACKGROUND ART

Paste- or film-like anisotropic conductive materials are utilized when mounting an IC chip on a wiring board. For example, FIG. 1 illustrates an IC chip 10 having bumps (including outer bumps 1a and inner bumps 1b) arranged in a staggered manner on at least a part of a peripheral portion of the back face of the IC chip. As illustrated in FIG. 2, an anisotropic conductive material is utilized when connecting the IC chip 10 to a wiring board 21, which has wiring terminals 20 corresponding to these outer bumps 1a and inner bumps 1b, via an anisotropic conductive material 22 by the application of heat and pressure by a heating and pressurizing head 23. Furthermore, FIG. 3 illustrates a flexible wire 33 on which linear electrodes 31 arranged in parallel on one face of a polyimide sheet 30 are exposed from a cover lay film 32. As illustrated in FIG. 4, an anisotropic conductive material is also utilized when connecting the flexible wire 33 to a glass substrate 35 for a display panel, which has wiring terminals 34 corresponding to the electrodes 31, via an anisotropic conductive material 36 by the application of heat and pressure by a heating and pressurizing head 37.

However, to reliably connect an electronic part such as an IC chip having bumps or connecting electrodes with a fine pitch to a wiring circuit board via an anisotropic conductive material, the conductive particles have to be made sufficiently available in a compression-bonding region, and excess binder has to be removed from the compression-bonding region.

Previously, to handle such demands, an anisotropic conductive material has been proposed in which a minimum melt viscosity is adjusted to be in a range of from $1 \times 10^6$ to $1 \times 10^9$ mPa·s (Patent Document 1, Claim 5 and paragraph [0031]).

[Patent Document 1] Japanese Patent Application Laid-Open No. 2000-340614

DISCLOSURE OF THE INVENTION

Problems to be Solved by the Invention

However, even when focusing only on the minimum melt viscosity and adjusting that value to be in a predetermined range, for an IC chip 10 like that illustrated in FIG. 1, there is the problem that conduction resistance tends to vary between the outer bumps 1a and the inner bumps 1b. Furthermore, for a flexible wire 33 like that illustrated in FIG. 3, there are the problems that conduction resistance among the plurality of linear electrodes also tends to vary between the electrodes at either side and the inner electrodes, and that the likelihood of IC chip operation defects and display panel malfunctions increases.

The present invention is provided to solve the problems in the conventional art such as those described above. It is an object of the present invention to provide an anisotropic conductive material which prevents conduction resistance from varying among bumps or among linear terminals when connecting an IC chip or a flexible wire to a wiring board via the anisotropic conductive material.

Means for Solving the Problems

The present inventors have discovered that the reason why conduction resistance varies among bumps or among linear terminals is that, during thermocompression bonding, depending on the position of the bump or linear terminal, the applied amount of heat or the rate of heating cannot be said to be completely equal. Consequently, depending on the position of the bump or linear terminal, the melt viscosity of the anisotropic conductive material is not the same, whereby variance occurs. For example, when the IC chip illustrated in FIG. 1 is subjected to thermocompression bonding for 5 seconds at 200° C., as illustrated in FIG. 5, in the temperature profile of the anisotropic conductive material for the outer bumps 1a with respect to time, temperature increases over time. However, because the heat tends to escape away from the outer bumps 1a, the temperature profile for the outer bumps 1a is positioned on the lower side (lower temperature side) of the temperature profile for the inner bumps 1b. This means that the pushing of the outer bumps 1a is not as sufficient as that of the inner bumps 1b, so that the conduction resistance for the outer bumps 1a becomes larger than the conduction resistance for the inner bumps 1b.

Applying the phenomenon illustrated in FIG. 5 to a relationship between melt viscosity and temperature gives a graph like that illustrated in FIG. 6. More specifically, in the melt viscosity profile of an anisotropic conductive material, the melt viscosity decreases as the temperature increases due to heating, and reaches a minimum melt viscosity at temperature $T_0$. If temperature increases further, a curing reaction becomes dominant, and the melt viscosity increases. Here, when the anisotropic conductive material of the inner bumps 1b exhibits a minimum melt viscosity at temperature $T_0$, the melt viscosity of the outer bumps 1a is at point P. Thus, the melt viscosity of the anisotropic conductive material varies depending on the position of the bump or linear terminal.

Based on this knowledge, when an anisotropic conductive material initially reaches the minimum melt viscosity at any connection region during connection of an electronic part to a wiring board via the anisotropic conductive material, the present inventors focused on the melt viscosity of the anisotropic conductive material of the other region which has not reached the minimum melt viscosity rather than focusing on only the minimum melt viscosity. Namely, the present inventors have researched the possibility that the breadth in divergence of connection resistance for each bump or connection pad can be reduced by achieving a fixed relationship between the melt viscosity of the material of the other region and the minimum melt viscosity. During this research, the present inventors have discovered that by focusing on a relationship between the minimum melt viscosity $[\eta_0]$ of the anisotropic conductive material and the melt viscosity $[\eta_1]$ at a temperature $T_1$ which is lower than the temperature $T_0$ at which the minimum melt viscosity is exhibited, generally, the temperature at which the melt viscosity of the anisotropic conductive material allows the bumps to be more easily pushed is a temperature 30° C. lower than the $T_0$ at which the minimum melt viscosity is exhibited. Furthermore, when the present inventors examined the ratio between the melt viscosity at that temperature with respect to the minimum melt viscosity, the inventors have discovered that the above-described objects of the present invention could be achieved if that ratio was 3 or less, thereby completing the present invention.

More specifically, the present invention provides an anisotropic conductive material including an insulating binder and a conductive particle dispersed in the insulating binder, wherein a minimum melt viscosity $[\eta_0]$ is in a range of from $1 \times 10^2$ to $1 \times 10^6$ mPa·sec, and satisfies the following equation (1).

$$1 < [\eta_1]/[\eta_0] \leq 3 \tag{1}$$

In the equation (1), $[\eta_0]$ represents a minimum melt viscosity of the anisotropic conductive material, and $[\eta_1]$ represents the melt viscosity at a temperature $T_1$ which is 30° C. lower than a temperature $T_0$ at which the minimum melt viscosity is exhibited.

Furthermore, the present invention provides a connected structure including an electronic part having a connection terminal arranged on one side thereof and a wiring board having a connection region formed corresponding to the connection terminal, the connection terminal and the connection region being connected via an anisotropic conductive material, wherein the anisotropic conductive material is the above-described anisotropic conductive material.

Furthermore, the present invention provides a method for producing this connected structure, comprising sandwiching the anisotropic conductive material between the connection terminal of the electronic part and the connection region of the wiring board, and heating and pressurizing the electronic part by a heating and pressurizing head.

Effects of the Invention

According to the present invention, conduction resistance can be prevented from varying among bumps or among linear terminals when connecting an IC chip or a flexible wire to a wiring board via an anisotropic conductive material.

BRIEF DESCRIPTION OF THE DRAWINGS

FIG. 1 is an explanatory diagram of a surface of an IC chip on which bumps are formed.

FIG. 2 is an explanatory diagram of when the IC chip is connected onto a wiring board.

FIG. 3 is an explanatory diagram of a flexible wire.

FIG. 4 is an explanatory diagram of when the flexible wire is connected onto a wiring board.

FIG. 5 shows a temperature profile of an anisotropic conductive material during thermocompression-bonding.

FIG. 6 shows a melt viscosity profile of an anisotropic conductive material during thermocompression-bonding.

| DESCRIPTION OF REFERENCE NUMERALS | |
|---|---|
| 1a | outer bump |
| 1b | inner bump |
| 10 | IC chip |
| 20, 34 | wiring terminal |
| 21 | wiring board |
| 22, 36 | anisotropic conductive material |
| 23, 37 | heating and pressuring head |
| 30 | polyimide sheet |
| 31 | electrode |
| 32 | cover lay film |
| 33 | flexible wire |
| 35 | glass substrate for a display panel |

BEST MODE FOR CARRYING OUT THE INVENTION

The present invention is an anisotropic conductive material including an insulating binder and a conductive particle dispersed in the insulating binder, wherein a minimum melt viscosity $[\eta_0]$ is in the range of from $1 \times 10^2$ to $1 \times 10^6$ mPa·sec, and satisfies the following equation (1).

$$1 < [\eta_1]/[\eta_0] \leq 3 \tag{1}$$

In the equation (1), $[\eta_0]$ represents the minimum melt viscosity of the anisotropic conductive material, and $[\eta_1]$ represents a melt viscosity at a temperature $T_1$ which is 30° C. lower than a temperature $T_0$ at which the minimum melt viscosity is exhibited. The term "melt viscosity" refers to a value obtained by measuring at predetermined conditions (rate of temperature increase 10° C./min; measurement pressure 5 g constant; used measurement plate diameter 8 mm) using a rotary type rheometer (for example, by TA Instruments).

In the present invention, the ratio of $[\eta_1]/[\eta_0]$ is 3 or less. This is because if this ratio is more than 3, sufficient connection cannot be achieved due to differences in viscosity between the inner and outer resin of the staggered bumps. Furthermore, since $[\eta_1]$ must be a larger value than $[\eta_0]$, the ratio of $[\eta_1]/[\eta_0]$ is a value exceeding 1. From the perspective of the above-described difference in viscosity, a preferred range for this ratio is expressed by the following equation (2).

$$1 < [\eta_1]/[\eta_0] \leq 2$$

The reason why the minimum melt viscosity $[\eta_0]$ of the anisotropic conductive material according to the present invention is in the range of from $1 \times 10^2$ to $1 \times 10^6$ mPa·sec is that if the minimum melt viscosity is less than this range, air bubbles tend to form, while if the minimum melt viscosity is more than this range, high pressure becomes necessary during mounting.

Furthermore, for the anisotropic conductive material according to the present invention, if the temperature $T_0$ at which the minimum melt viscosity is exhibited is too low, the anisotropic conductive material cures when the bumps contact as far as the wiring during mounting, whereby sufficient connection cannot be achieved. If the temperature $T_0$ is too high, a long time is required for the mounting. Therefore, the temperature $T_0$ is preferably 90 to 120° C., and more preferably 90 to 100° C.

As the conductive particles forming the anisotropic conductive material according to the present invention, conductive particles which are used in a conventional anisotropic conductive material may be appropriately selected and used. Examples thereof may include metal particles of gold, nickel, solder and the like, metal coated resin particles formed by coating benzoguanamine resin with a Ni/Au thin film, and insulation coated conductive particles formed by coating an insulating resin thin film on such surfaces of these particles. The particle size of these conductive particles is normally 1 to 10 μm, and preferably 2 to 5 μm.

As the insulating binder forming the anisotropic conductive material according to the present invention, an insulating binder which is used in a conventional anisotropic conductive material may be appropriately selected and used. The insulating binder may appropriately include, in an insulating resin such as an epoxy monomer or oligomer, a phenoxy resin, or a liquid or solid epoxy resin, various kinds of additive, for example a curing agent such as an amine curing agent and an imidazole curing agent, optionally an organic solvent such as toluene, as well as a pigment, anti-corrosion agent and the like.

The anisotropic conductive material according to the present invention can be produced by mixing the above-described components by an ordinary method. Furthermore, the inventive anisotropic conductive material may be used by processing into a film by an ordinary method.

Adjustment of the minimum melt viscosity and the ratio of $[\eta_1]/[\eta_0]$ of the anisotropic conductive material according to the present invention to be in the predetermined ranges can be carried out by appropriately selecting the kind and amount of the insulating resin, the kind, particle size, and amount of the conductive particles, and the kind and amount of the solvent. It is especially preferred to adjust by adding an organic filler. Examples of such an organic filler include insulating resins such as a butadiene copolymer, an acrylic copolymer, a styrene copolymer and the like. A-B type or A-B-A type block copolymers are formed from a compatible segment which is compatible with a polymerizable resin component and an incompatible segment which is not compatible with a polymerizable resin component. Especially preferred examples of such block copolymers include styrene block copolymers such as a styrene-acrylic block copolymer, styrene-butadiene block copolymer, styrene-vinyl acetate block copolymer, styrene-ethylene-butylene block copolymer, styrene-ethylene-propylene block copolymer, styrene-ethylene-styrene block copolymer, styrene-isoprene block copolymer and the like. Among these styrene block copolymers, from the perspective of a balance between dispersibility and viscosity, most preferred is a styrene block copolymer having a styrene copolymer composition ratio of 20 wt % or more. Such styrene block copolymers may also include epoxy groups and carboxyl groups in an arbitrary range. Furthermore, a commercially-available product may also be used for the block copolymer.

If the particle size of the insulating resin filler is too small, dispersion is difficult, while if the particle size is too large, there is a large adverse impact on connection by the conductive particles on the wiring. Therefore, the particle size is preferably 0.01 to 10 μm, and more preferably 0.1 to 1 μm.

The above-described anisotropic conductive material according to the present invention can be applied during production of a connected structure. More specifically, the present invention also encompasses a connected structure including an electronic part on which a connection terminal is arranged on one side thereof and a wiring board having a connection region formed corresponding to the connection terminal, the connection terminal and the connection region being connected via the anisotropic conductive material according to the present invention.

Examples of the electronic part forming such a connected structure include, but are not limited to, the IC chip illustrated in FIG. 1, which has a plurality of bumps or connection pads arranged in a staggered manner on at least a part of a peripheral portion of the back face of the IC chip, and the flexible printed wire sheet illustrated in FIG. 3, which has a plurality of linear wires arranged in parallel on one face of the sheet.

Wiring boards in which anisotropic conductive materials have conventionally been used are also within the scope of the present invention. Further examples of the wiring board include flexible wiring boards, glass epoxy wiring boards, laminated wiring boards, transparent glass for displays, and resin wiring boards.

Such a connected structure can be produced by sandwiching the anisotropic conductive material according to the present invention between the connection terminals of an electronic part and the connection regions of a wiring board, and heating and pressurizing the electronic part by a heating and pressurizing head.

EXAMPLES

The present invention will now be described in more detail with the following examples.

Reference Example 1

Synthesis of Styrene Block Copolymer Particles

A glass reaction vessel equipped with a thermometer, a nitrogen introduction pipe, a stirrer, and a condenser, was charged with 300 parts by mass of water, 15 parts by mass of a 1% aqueous solution of partially saponified polyvinyl alcohol (Gohsenol KH-17, manufactured by Nippon Synthetic Chemical Industry Co., Ltd.), and 15 parts by mass of a 10% aqueous dispersion of hydroxyapatite (Supatite 10, manufactured by Nippon Chemical Industrial Co., Ltd.). 0.5 parts by mass of a polymeric peroxide was dispersed in the resultant aqueous solution at room temperature over 1 hour. Then, 30 parts by mass of vinyl acetate was added to the mixture, and while introducing nitrogen into the reaction vessel, polymerization (first stage polymerization) was carried out for 2 hours at 60° C. under stirring. The resultant mixture was then cooled to room temperature, 70 parts by mass of styrene was charged into the reaction vessel, and the mixture was stirred for 1 hour at room temperature. Furthermore, while introducing nitrogen into the reaction vessel, the mixture was stirred for 8 hours at 80° C., and then polymerization (second stage polymerization) was carried out for 30 minutes at 90° C. The reaction mixture was then cooled to room temperature, to obtain a polymerization product as a sediment. The obtained polymerization product was washed with 130 parts by mass of 5% hydrochloric acid, then washed with water and separated by filtration. The obtained polymerization product was dried to obtain a styrene block copolymer in the form of white particles at an yield of 85%. The copolymer composition ratio of the styrene and the vinyl acetate in this block copolymer was 70:30.

Examples 1 and 2, Comparative Examples 1 and 2

Film-like anisotropic conductive materials were prepared by uniformly mixing the components shown in Table 1 (parts by mass) using a planetary stirrer. The melt viscosity and conduction resistance of the obtained anisotropic conductive materials were measured as described below.

<Melt Viscosity Measurement>

The melt viscosity of the anisotropic conductive materials was measured under conditions of a rate of temperature increase of 10° C./min, a measurement pressure of 5 g constant, and a used measurement plate diameter of 8 mm using a rotary type rheometer (by TA Instruments). The results of the obtained minimum melt viscosity $[\eta_0]$ (Pa·sec), the temperature $T_0$ (° C.) at that point, and the melt viscosity $[\eta_1]$ (Pa·sec) at the temperature $T_1$ which is 30° C. lower than $T_0$ are shown in Table 1.

<Conduction Resistance Measurement>

The anisotropic conductive material was coated in the form of a release film using a bar coater, and then pre-baked at 80° C. for 5 minutes to produce an anisotropic conductive film. The obtained anisotropic conductive film was sandwiched between a test IC chip (bump size 1800 μm$^2$, bump height 15 μm, distance between outer bump line and inner bump line 20 μm, distance between bumps within each line 20 μm) having gold bumps arranged in a staggered manner, and a corresponding glass substrate, and then heated and pressurized for 5 seconds at a pressure of 60 MPa and a temperature of 200° C. by a heating and pressurizing head. The conduction resistance (Ω) of the outer bumps and the inner bumps at that stage was measured by an ordinary method. The obtained results are shown in Table 1.

TABLE 1

| Component | Comparative Example 1 | Comparative Example 2 | Example 1 | Example 2 |
|---|---|---|---|---|
| Phenoxy Resin (YP50, Tohto Kasei Co., Ltd.) | 30 | 30 | 30 | 30 |
| Liquid Epoxy Resin (EP-828, Japan Epoxy Resins Co., Ltd.) | 30 | 30 | 30 | 30 |
| Imidazole Curing Agent (HX3941HP, Asahi Kasei Corporation) | 30 | 30 | 30 | 30 |
| Styrene-Vinyl Acetate Block Copolymer Particles (synthesized in Reference Example 1) | 0 | 5 | 10 | 15 |
| Conductive Particles (particle size 3 μm: Sekisui Chemical Co., Ltd.) | 21 | 21 | 21 | 21 |
| Minimum Melt Viscosity $[\eta_0]$ (Pa·sec) | $4.30 \times 10^2$ | $6.43 \times 10^2$ | $9.00 \times 10^2$ | $1.10 \times 10^3$ |
| Temperature $T_0$ (° C.) at Minimum Melt Viscosity | 90 | 94 | 96 | 97 |
| Melt Viscosity $[\eta_1]$ (Pa·sec) at Temperature $T_1$ (=$T_0$ − 30° C.) | $1.60 \times 10^3$ | $2.10 \times 10^3$ | $2.52 \times 10^3$ | $2.69 \times 10^3$ |
| Ratio of $[\eta_1]/[\eta_0]$ | 3.72 | 3.27 | 2.80 | 2.45 |
| Conduction Resistance (Ω) of Inner Bumps Arranged in Staggered Manner | 0.4 | 0.5 | 0.5 | 0.4 |
| Conduction Resistance (Ω) of Outer Bumps Arranged in Staggered Manner | 4.3 | 2.8 | 0.4 | 0.4 |

As can be seen from Table 1, the anisotropic conductive materials of Examples 1 and 2 have a minimum melt viscosity $[\eta_0]$ in the range of from $1 \times 10^2$ to $1 \times 10^6$ mPa·sec, and a ratio of $[\eta_1]/[\eta_0]$ of less than 3. Therefore, the respective conduction resistances of the outer bumps and inner bumps arranged in a staggered manner are 0.5Ω or less, and there is also hardly any variation among them.

In contrast, for the anisotropic conductive materials of Comparative Examples 1 and 2, although the minimum melt viscosity $[\eta_0]$ is in the range of from $1 \times 10^2$ to $1 \times 10^6$ mPa·sec, the ratio of $[\eta_1]/[\eta_0]$ is more than 3. Therefore, although the conduction resistance of the inner bumps arranged in a staggered manner was 0.5Ω or less, the conduction resistance of the outer bumps arranged in a staggered manner is increased by 7 to 10 times, whereby it can be seen that these anisotropic conductive materials are lacking in conduction resistance stability.

Example 3, Comparative Examples 3 to 5

Film-like anisotropic conductive materials were prepared by uniformly mixing the components shown in Table 2 (parts by mass) using a planetary stirrer. The melt viscosity and conduction resistance of the obtained anisotropic conductive materials were measured in the same manner as in Example 1.

TABLE 2

| Component | Example 3 | Comparative Example 3 | Comparative Example 4 | Comparative Example 5 |
|---|---|---|---|---|
| Phenoxy Resin (YP50, Tohto Kasei Co., Ltd.) | 35 | 30 | 20 | 20 |
| Liquid Epoxy Resin (EP-828, Japan Epoxy Resins Co., Ltd.) | 30 | 30 | 30 | 25 |
| Imidazole Curing Agent (HX3941HP, Asahi Kasei Corporation) | 25 | 25 | 20 | 28 |
| Styrene-Vinyl Acetate Block Copolymer Particles (synthesized in Reference Example 1) | 15 | 0 | 0 | 0 |
| Conductive Particles (particle size 3 μm: Sekisui Chemical Co., Ltd.) | 21 | 21 | 21 | 21 |
| Minimum Melt Viscosity $[\eta_0]$ (Pa·sec) | $1.1 \times 10^4$ | $1.6 \times 10^3$ | $2.1 \times 10^2$ | $5.4 \times 10^3$ |
| Temperature $T_0$ (° C.) at Minimum Melt Viscosity | 102 | 101 | 111 | 105 |
| Melt Viscosity $[\eta_1]$ (Pa·sec) at Temperature $T_1$ (=$T_0$ − 30° C.) | $2.6 \times 10^4$ | $9.5 \times 10^3$ | $1.0 \times 10^3$ | $2.8 \times 10^4$ |
| Ratio of $[\eta_1]/[\eta_0]$ | 2.4 | 5.9 | 4.8 | 5.2 |
| Conduction Resistance (Ω) of Inner Bumps Arranged in Staggered Manner | 0.3 | 0.6 | 3.2 | 0.4 |
| Conduction Resistance (Ω) of Outer Bumps Arranged in Staggered Manner | 0.4 | 3.2 | 5.6 | 5.2 |

As can be seen from Table 2, the anisotropic conductive material of Example 3 has a minimum melt viscosity [$\eta_0$] in the range of from $1\times10^2$ to $1\times10^6$ mPa·sec, and a ratio of [$\eta_1$]/[$\eta_0$] of less than 3. Therefore, the respective conduction resistances of the outer bumps and inner bumps arranged in a staggered manner are 0.5Ω or less, and there is also hardly any variation among them.

In contrast, for the anisotropic conductive materials of Comparative Examples 3 to 5, although the minimum melt viscosity [$\eta_0$] is in the range of from $1\times10^2$ to $1\times10^6$ mPa·sec, the ratio of [$\eta_1$]/[$\eta_0$] is more than 3. Therefore, a conduction resistance of 0.5Ω or more is exhibited for the inner bumps or outer bumps arranged in a staggered manner, or for both the inner and outer bumps. Moreover, the conduction resistance of the outer bumps is increased by 1.75 to 13 times that of the inner bumps, whereby it can be seen that these anisotropic conductive materials are lacking in conduction resistance stability.

INDUSTRIAL APPLICABILITY

The anisotropic conductive material according to the present invention can prevent the variation of conduction resistance among bumps or among linear terminals when connecting an IC chip or a flexible wire to a wiring board via the anisotropic conductive material. Therefore, the anisotropic conductive material according to the present invention is useful as an anisotropic conductive sheet when mounting an electronic part such as an IC chip on a flexible wiring board.

The invention claimed is:

1. An anisotropic conductive material, comprising an insulating binder and a conductive particle dispersed in the insulating binder, wherein a minimum melt viscosity [$\eta_0$] is in a range of from $1\times10^2$ to $1\times10^6$ mPa·sec, and satisfies the following equation (1):

$$1 < [\eta_1]/[\eta_0] \leq 3 \quad (1)$$

where in the equation (1), [$\eta_0$] represents the minimum melt viscosity of the anisotropic conductive material, and [$\eta_1$] represents a melt viscosity at a temperature $T_1$ which is 30° C. lower than a temperature $T_0$ at which the minimum melt viscosity is exhibited.

2. The anisotropic conductive material according to claim 1, wherein the temperature $T_0$ is 90 to 120° C.

3. The anisotropic conductive material according to claim 1, comprising an organic filler.

4. A connected structure comprising: an electronic part having a connection terminal arranged on one side thereof; and a wiring board having a connection region formed corresponding to the connection terminal, the connection terminal and the connection region being connected via an anisotropic conductive material, wherein the anisotropic conductive material is the anisotropic conductive material according to claim 1.

5. The connected structure according to claim 4, wherein the electronic part is an IC chip having a plurality of bumps or connection pads arranged in a staggered manner on at least a part of a peripheral portion of a back face of the IC chip.

6. The connected structure according to claim 4, wherein the electronic part is a flexible printed wire sheet having a plurality of linear wires arranged in parallel on one face of the sheet.

7. A method for producing the connected structure according to claim 4, comprising sandwiching the anisotropic conductive material between the connection terminal of the electronic part and the connection region of the wiring board, and heating and pressurizing the electronic part by a heating and pressurizing head.

* * * * *